(12) United States Patent
Tsai

(10) Patent No.: US 9,442,537 B2
(45) Date of Patent: Sep. 13, 2016

(54) SERVER WITH DETACHABLE PANEL MODULE AND DETACHABLE MODULE STRUCTURE

(71) Applicant: WISTRON CORP., New Taipei (TW)

(72) Inventor: Chi-Ken Tsai, New Taipei (TW)

(73) Assignee: WISTRON CORP., New Taipei (TW)

( * ) Notice: Subject to any disclaimer, the term of this patent is extended or adjusted under 35 U.S.C. 154(b) by 12 days.

(21) Appl. No.: 14/696,206

(22) Filed: Apr. 24, 2015

(65) Prior Publication Data

US 2016/0085274 A1    Mar. 24, 2016

(30) Foreign Application Priority Data

Sep. 19, 2014   (TW) .............................. 103216725 A

(51) Int. Cl.
*H05K 7/00* (2006.01)
*G06F 1/18* (2006.01)

(52) U.S. Cl.
CPC .............. *G06F 1/182* (2013.01); *G06F 1/183* (2013.01)

(58) Field of Classification Search
CPC ............ H05K 7/1487; H05K 5/0204; H05K 7/1409; H05K 7/1492; H05K 7/1411; H05K 5/00; H05K 7/1422; H02J 9/02; H02J 9/065; H02J 1/00; H02J 7/025; H02J 9/061; H02J 5/005; H02J 7/0044; H02J 7/0068; H02J 7/34; H02J 7/345; G06F 1/16; G06F 1/184; G06F 1/185; G06F 1/181; G06F 1/182; G06F 1/183; G06F 1/203; G06F 1/187; G06F 1/1613; G11B 33/128; G11B 33/127

USPC ............ 361/679.01, 679.02, 679.33–679.39, 361/679.55–679.58, 724–727, 728, 752, 361/730, 732, 736, 740, 747, 748, 754, 758, 361/759; 312/223.1–223.2
See application file for complete search history.

(56) References Cited

U.S. PATENT DOCUMENTS 7,117,510 B2 * 10/2006 Lu ........................... B60R 11/02
                                                              720/647

FOREIGN PATENT DOCUMENTS

TW            M247939 U    10/2004

\* cited by examiner

*Primary Examiner* — Anthony Haughton
*Assistant Examiner* — Ingrid Wright
(74) *Attorney, Agent, or Firm* — Maschoff Brennan

(57) ABSTRACT

A server with a detachable panel module includes a case with an accommodating space, a circuit board module and a panel module. The circuit board module includes a circuit board, a first assembling frame and a button. The first assembling frame includes a first plate. The first plate is installed in the accommodating space. The circuit board is installed on the first plate. The button is movable relative to the first plate. The panel module includes a panel and a second assembling frame. The second assembling frame includes a second plate, a plurality of elastic arms. The plurality of elastic arms is connected to the second plate. The panel is installed on the second plate. When the button is separated from the second plate, the elastic force of the plurality of elastic arms making the panel module leaves the accommodating space.

21 Claims, 13 Drawing Sheets

SERVER WITH DETACHABLE PANEL MODULE AND DETACHABLE MODULE STRUCTURE

CROSS-REFERENCE TO RELATED APPLICATIONS

This non-provisional application claims priority under 35 U.S.C. §119(a) on Patent Application No(s). 103216725 filed in Taiwan, R.O.C. on Sep. 19, 2014, the entire contents of which are hereby incorporated by reference.

TECHNICAL FIELD

The disclosure relates to a server, more particularly to a server with a detachable panel module and a detachable module structure.

BACKGROUND

With the development in computer science, cloud computing is widely used and has become more popular. Cloud computing, a kind of internet-based computing approach, can be progressed through several computers communicated by the internet. Alternatively, several computers are capable of accessing services or information from a host server. The cloud storage service allows the users to access data stored in the host server through the internet, which means users can store certain data in the host server instead of storing the data in their own computers. Hence, certain files can be downloaded in anywhere only if the internet is available there.

A cloud storage service comprises an internet storage server. A bearing plate of the internet storage server is usually equipped with a display panel. The display panel has status signals indicating the use of the electrical connecting slots located inside the bearing plate. However, the display panel is fixed on the bearing plate by screwing from the inside surface of the bearing plate. When the display panel is failed and needs to be removed, some components located inside the bearing plate need to be removed first, and then the screws need to be loosened from the inside of the bearing plate. Therefore, it is inconvenient for users to replace the display panel.

SUMMARY

According to one embodiment of the present disclosure discloses a server with a detachable panel module. The server comprises a case, a circuit board module, and a panel module. The bearing case has a bottom surface and a side surface, and the bottom surface and the side surface form an accommodating space together. The circuit board module comprises a circuit board, a first assembling frame and a button. The first assembling frame comprises a first plate, a plurality of fixing blocks and at least a pressing block. The first plate is installed in the accommodating space. Both of the plurality of fixing blocks and the pressing block are connected to the first plate. The circuit board is installed on the first plate. The button is set on the first plate. The button has a limiting surface. The limiting surface faces the side surface. The button is movable relative to the bottom surface to have a restricting position and a releasing position. The releasing position is closer to the bottom surface than the restricting position. The panel module comprises a panel and a second assembling frame. The second assembling frame comprises a second plate, a first elastic arm and at least a second elastic arm. The second plate has a plurality of fixing slots corresponding to the plurality of fixing blocks, respectively. The first elastic arm and the second elastic arm are both connected to the second plate and correspond to the side surface and the pressing block, respectively. The panel is installed on the second plate. The second assembling frame is detachably installed in the accommodating space. When the second assembling frame is in the accommodating space, and the button is at the restricting position, the plurality of fixing slots are fixed with the plurality of fixing blocks, and the first elastic arm and the second elastic arm are pressed by the side surface and the pressing block, respectively so as to store an elastic potential energy. In addition, the limiting surface interferes with the second plate so as to fix the second assembling frame in the accommodating space. When the button is moved from the restricting position to the releasing position, the limiting surface leaves from and stops interfering with the second plate. The elastic potential energy released by the first elastic arm drives the second plate to move toward a direction away from the side surface and drives the plurality of fixing slots to leave from the plurality of fixing blocks, and the elastic potential energy released by the second elastic arm drives the second plate to move toward a direction away from the bottom surface.

Another embodiment of the present disclosure discloses a detachable module structure.

The detachable module structure comprises a bearing case, a circuit board module and a panel module. The bearing case has a bottom surface and a side surface, and the bottom surface and the side surface form an accommodating space together. The circuit board module comprises a circuit board, a first assembling frame and a button. The first assembling frame comprises a first plate and a plurality of fixing blocks. The first plate is installed in the accommodating space. The plurality of fixing blocks is connected to the first plate. The circuit board is installed on the first plate. The button is set on the first plate. The button has a limiting surface. The limiting surface faces the side surface. The button is movable relative to the bottom surface to have a restricting position and a releasing position. The releasing position is closer to the bottom surface than the restricting position. The panel module comprises a panel and a second assembling frame. The second assembling frame comprises a second plate and a first elastic arm. The second plate has a plurality of fixing slots corresponding to the plurality of fixing blocks respectively. The first elastic arm is connected to the second plate and corresponds to the side surface. The panel is installed on the second plate. The second assembling frame is detachably set in the accommodating space. When the second assembling frame is in the accommodating space, and the button is at the restricting position, the plurality of fixing slots are fixed with the plurality of fixing blocks, and the first elastic arm is pressed by the side surface so as to store an elastic potential energy. In addition, and the limiting surface interferes with the second plate so as to fix the second assembling frame in the accommodating space. When the button is moved from the restricting position to the releasing position, the limiting surface leaves from and stops interfering with the second plate, the elastic potential energy released by the first elastic arm drives the second plate to move toward a direction away from the side surface and drives the plurality of fixing slots to leave from the plurality of fixing blocks.

BRIEF DESCRIPTION OF THE DRAWINGS

The present disclosure will become more fully understood from the detailed description given herein below, along with the accompanying drawings which are for illustration only, thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
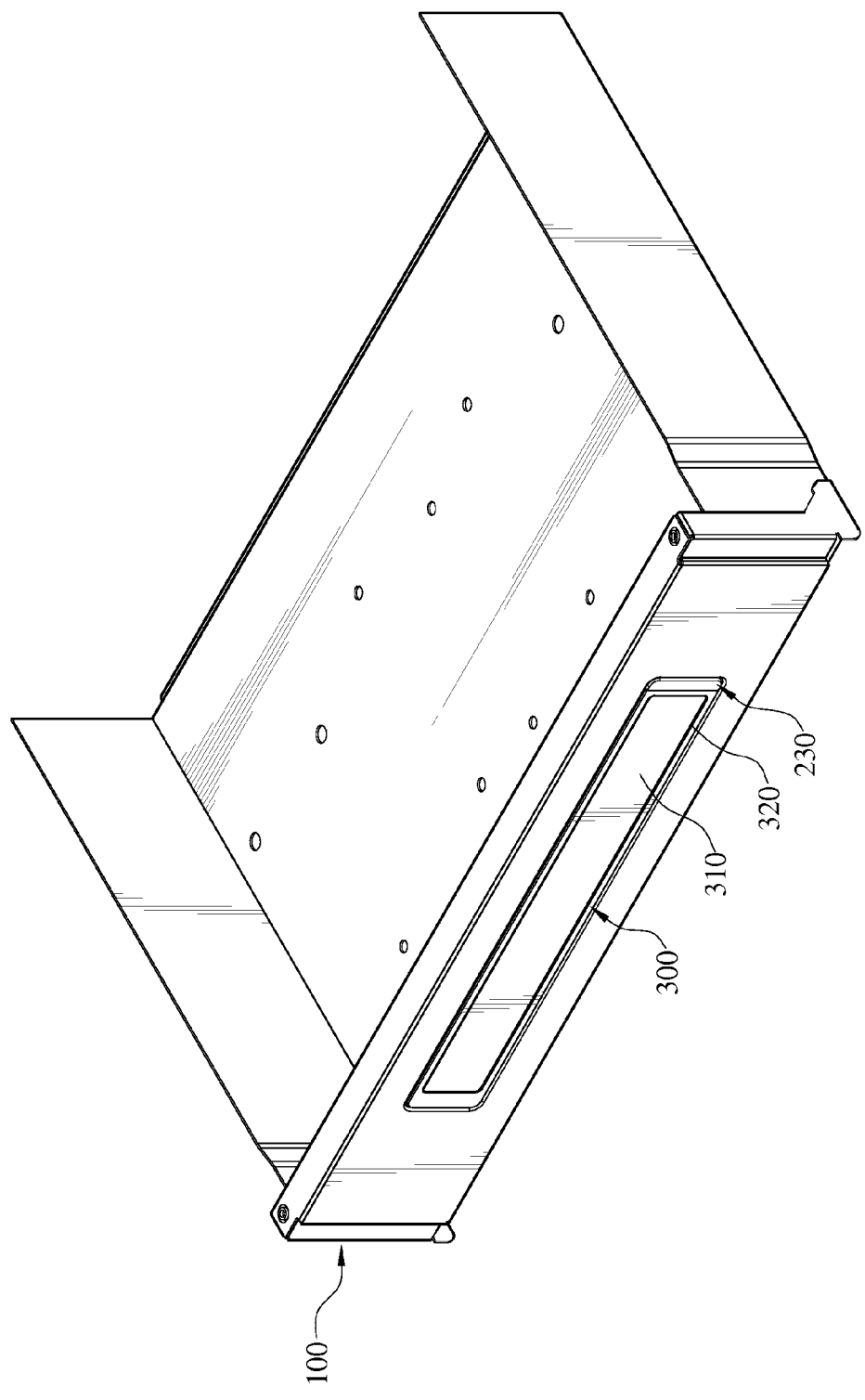
FIG. 1A is a partial schematic view of a server with a detachable panel module according to an embodiment of the disclosure.
Figure 1B:
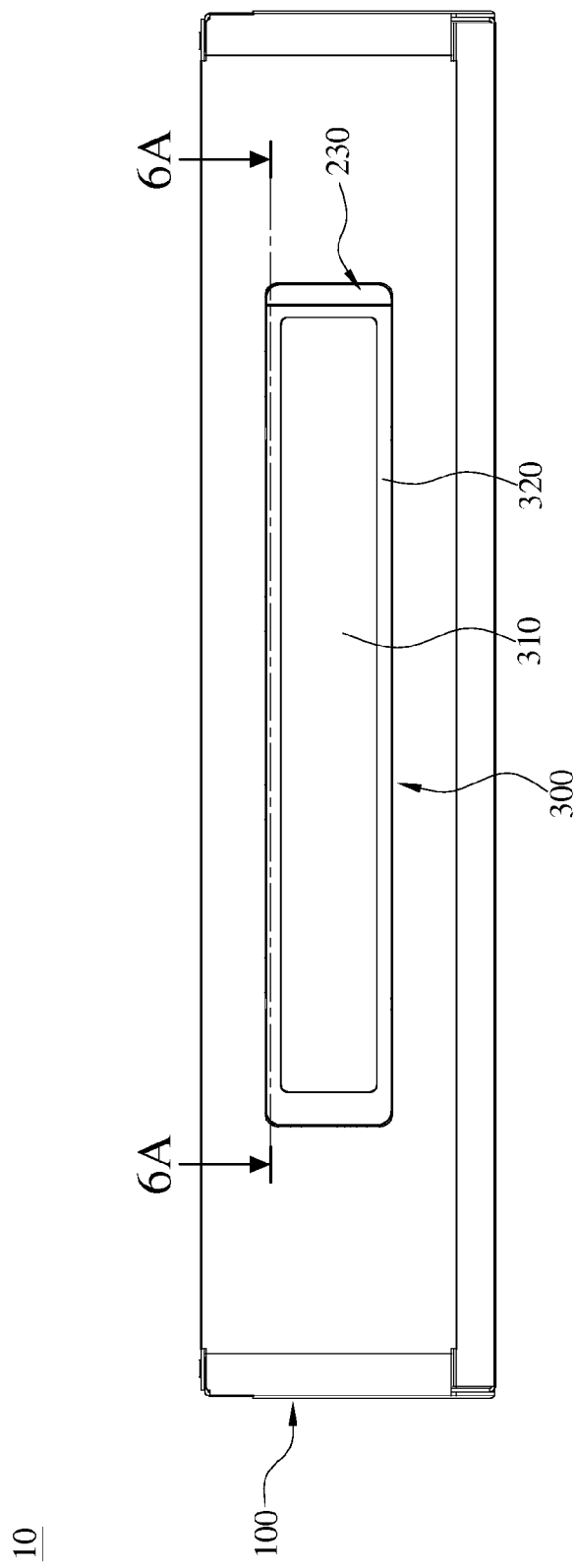
FIG. 1B is a front view of the server with the detachable panel module in FIG. 1A according to the embodiment of the disclosure.
Figure 2:
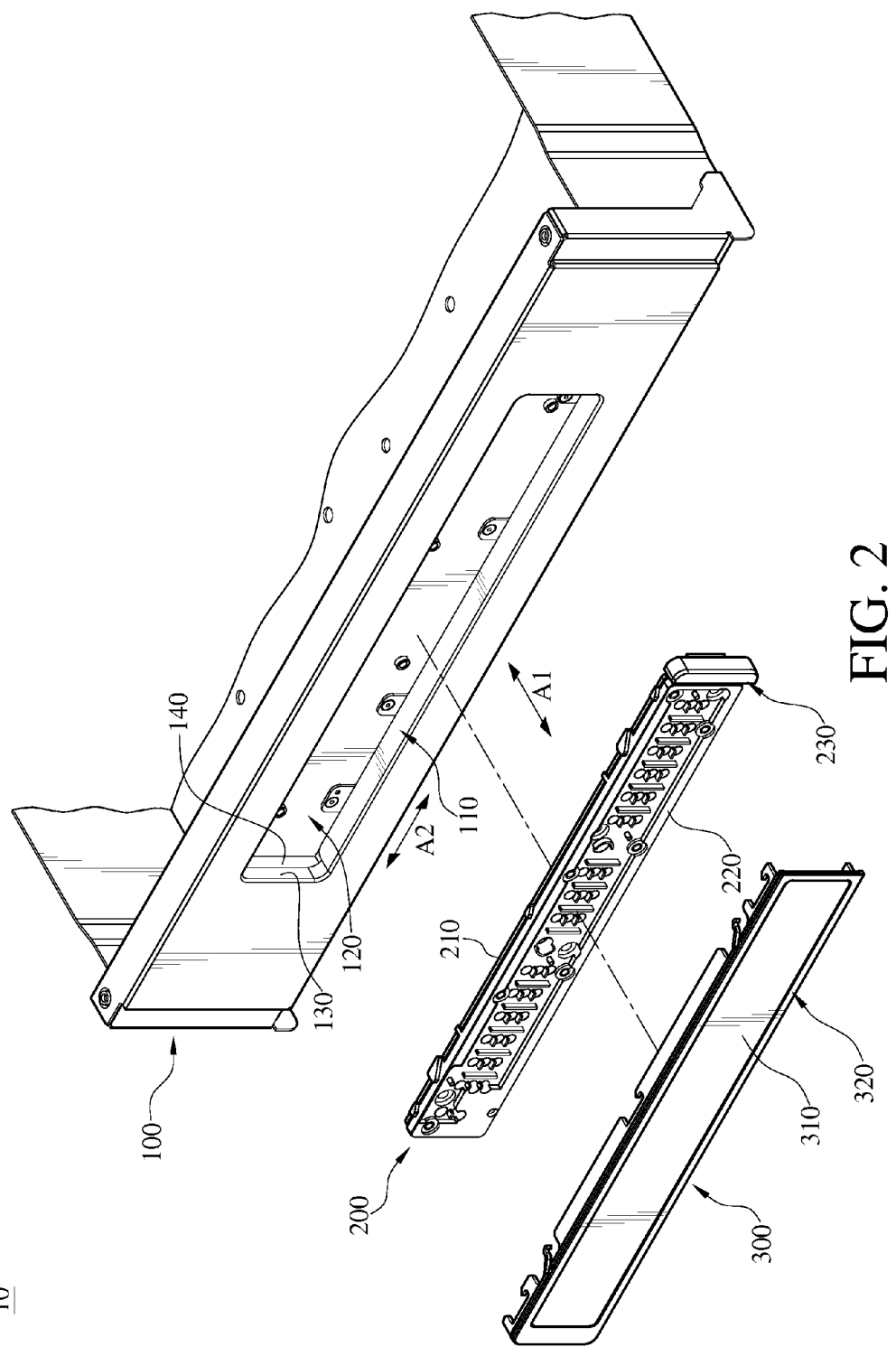
FIG. 2 is an exploded view of the server with the detachable panel module in FIG. 1A according to the embodiment of the disclosure.
Figure 3:
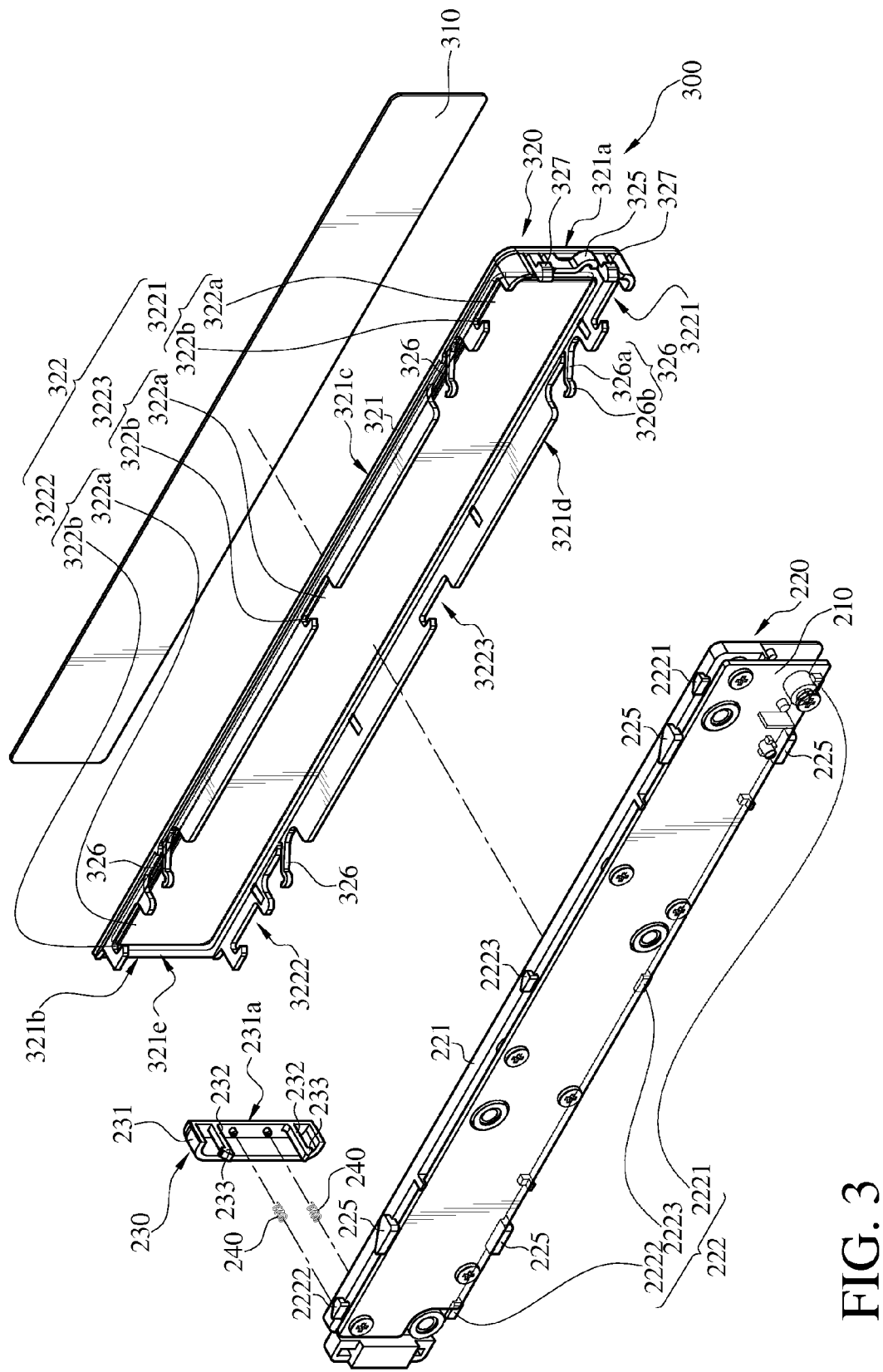
FIG. 3 is an exploded view of the circuit board module and the panel module in FIG. 2 according to the embodiment of the disclosure.

Please refer to FIG. 1A to FIG. 3. FIG. 1A is a partial schematic view of a server with detachable panel module according to an embodiment of the disclosure, FIG. 1B is a front view of the server with the detachable panel module in FIG. 1A according to the embodiment of the disclosure, FIG. 2 is an exploded view of the server with the detachable panel module in FIG. 1A according to the embodiment of the disclosure, and FIG. 3 is an exploded view of the circuit board module and the panel module in FIG. 2 according to the embodiment of the disclosure.

In this embodiment of the disclosure, the server 10 comprises a case 100, a circuit board module 200, and a panel module 300 which is detachable. The case 100 has a bottom surface 120 and a side surface 130, and the bottom surface 120 and the side surface 130 form an accommodating space 110 together. The case 100 further has a fixing groove 140 located at the side surface 130.

In addition, for clearly describing the location and movement of the components, a first axis A1 (shown in FIG. 2) is defined as being parallel to a normal line of the bottom surface 120. A second axis A2 (shown in FIG. 2) is defined as being parallel to a normal line of the side surface 130.

The circuit board module 200 comprises a circuit board 210, a first assembling frame 220, a button 230, and an elastic piece 240. The first assembling frame 220 comprises a first plate 221, a plurality of fixing blocks 222 and a plurality of pressing blocks 225. The first plate 221 is detachably installed on the bottom surface 120 and located in the accommodating space 110.

These fixing blocks 222 and these pressing blocks 225 are connected to the top side and the bottom side of the first plate 221 which are opposite to each other. In this embodiment, these fixing blocks 222 comprise two first fixing blocks 2221, two second fixing blocks 2222 and two third fixing blocks 2223. One of the first fixing blocks 2221 and one of the second fixing blocks 2222 are located on the top side of the first plate 221, and the other first fixing block 2221 and the other second fixing block 2222 are located on the bottom side of the first plate 221. The first fixing blocks 2221 and the second fixing blocks 2222 are located on the left ends and the right ends of the top side and the bottom side of the first plate 221. The third fixing blocks 2223 are located between the corresponding first fixing blocks 2221 and the corresponding second fixing blocks 2222, respectively. The number of the pressing blocks 225 is four, and the pressing blocks 225 are located on the top side of the first plate 221 and the bottom side of the first plate 221, respectively.

Figure 4:
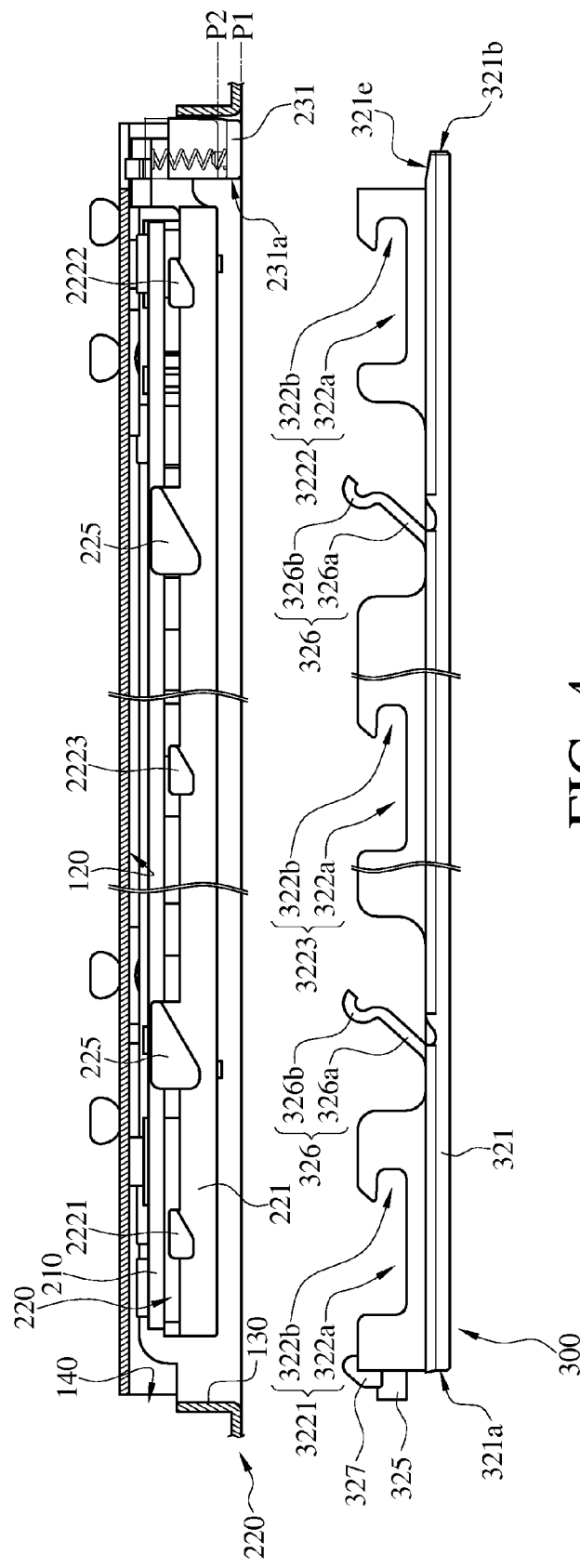
FIG. 4 is a cross-sectional view of the circuit board module and the panel module separated in FIG. 1B according to the embodiment of the disclosure.

The circuit board 210 is installed on the first plate 221 (e.g., by screwing) and electrically connected to the electric slot in the case 100. The button 230 comprises a pressing plate 231, a connecting block 232 and a restricting block 233. The pressing plate 231 and the restricting block 233 are connected to two sides of the connecting block 232 opposite to each other, respectively. The connecting block 232 passes through the first plate 221. The elastic piece 240 is interposed between the first plate 221 and the pressing plate 231 so that the restricting block 233 leans against a side of the first plate 221 away from the pressing plate 231. Please refer to FIG. 4, FIG. 4 is a cross-sectional view of the circuit board module and the panel module separated in FIG. 2 according to the embodiment of the disclosure. The button 230 is movable along the first axis A1 to be relatively farther away from the bottom surface 120 or relatively closer to the bottom surface 120 and has a restricting position P1 and a releasing position P2. The elastic force of the elastic piece 240 drives the button 230 to locate at the restricting position P1, normally. The button 230 has a limiting surface 231a which faces the side surface 130. Preferably, the limiting surface 231a is parallel to the side surface 130 so as to restrain the panel module 300 from movement effectively.

The panel module 300 comprises a panel 310 and a second assembling frame 320. The panel 310, for example, is a display panel or a touch display panel. The second assembling frame 320 comprises a second plate 321, a first elastic arm 325, a plurality of second elastic arms 326 and two fixing bumps 327.

The second plate 321 comprises a first side surface 321a and a second side surface 321b which are opposite to each other. In other words, the first side surface 321a and the second side surface 321b are the right side and the left side of the second plate 321, respectively. The first side surface 321a faces the side surface 130. The second plate 321 further comprises a top side 321c and a bottom side 321d which are opposite to each other and which are located between the first side surface 321a and the second side surface 321b. The top side 321c and the bottom side 321d have a plurality of fixing slots 322, respectively. These fixing slots 322 comprise two first fixing slots 3221, two second fixing slots 3222 and two third fixing slots 3223. The first fixing slot 3221, the second fixing slot 3222 and the third fixing slot 3223 correspond to the first fixing block 2221, the second fixing block 2222 and the third fixing block 2223, respectively.

In this embodiment, each of the fixing slots 322 has a releasing section 322a and a fixing section 322b extending along the second axis A2. The fixing blocks 222 are for entering or detaching from the fixing slots 322 through the releasing section 322a. In addition, the second plate 321 further comprises a pressing surface 321e. The pressing surface 321e faces the bottom surface 120 and corresponds to the button 230.

The first elastic arm 325 connects to the second plate 321 and protrudes outward from the first side surface 321a. The first elastic arm 325 corresponds to the side surface 130. These second elastic arms 326 are connected to the top side 321c and the bottom side 321d of the second plate 321, respectively. The second elastic arms 326 correspond to the pressing blocks 225, respectively. In this embodiment, the second elastic arm 326 comprises a first tilting section 326a and a second tilting section 326b that are connected with each other. An enclosed angle between an extending direction of the first tilting section 326a and the second axis A2 is smaller than an enclosed angle between an extending direction of the second tilting section 326b and the second axis A2. Thus, the first tilting section 326a and the second tilting section 326b form an obtuse angle therebetween.

Due to the tilting angle difference between the first tilting section 326a and the second tilting section 326b of the second elastic arm 326, the second elastic arm 326 generates an elastic recovery force along the first axis A1 and an elastic recovery force along the second axis A2 when pressed by the pressing block 225.

The panel 310, for example, is installed on the second plate 321 by screwing. When the second assembling frame 320 is installed on the first assembling frame 220, the panel and the circuit board 210 are electrically connected to each other so as to display working statuses of each electric slot. The two fixing bumps 327 protrude outward from the first side surface 321a and correspond to two fixing holes.

Figure 5A:
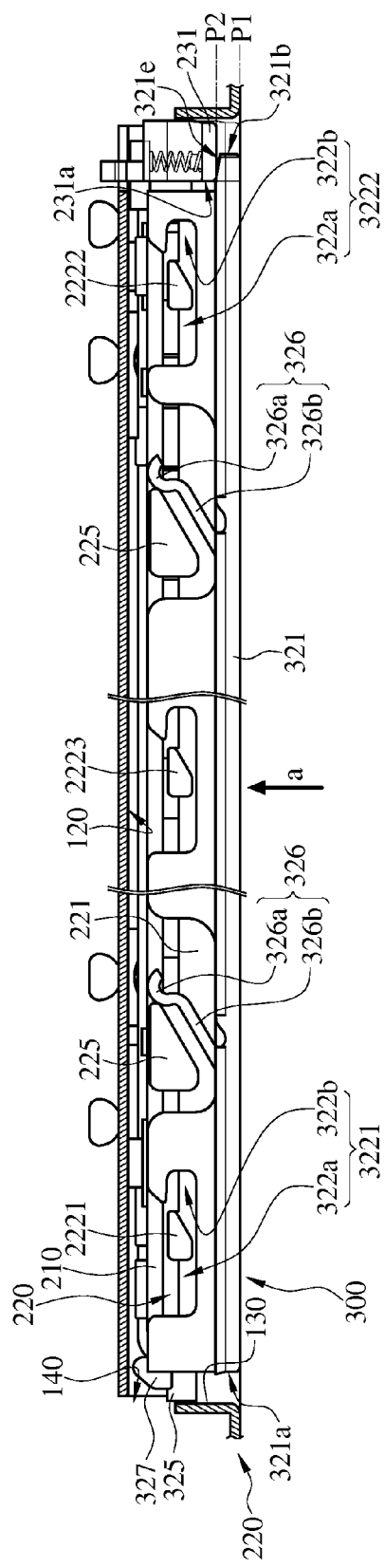
FIG. 5A is a cross-sectional view of the panel module pressing the button in FIG. 1B according to the embodiment of the disclosure.
Figure 5B:
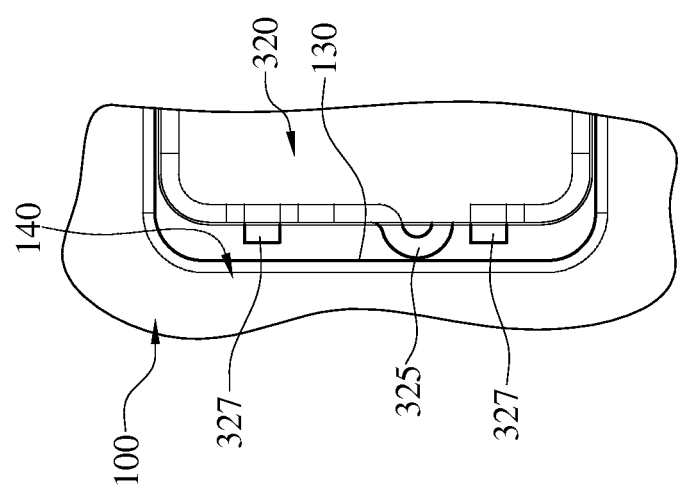
FIG. 5B is a partial front view of the panel module pressing the button in FIG. 1B according to the embodiment of the disclosure.
Figure 6A:
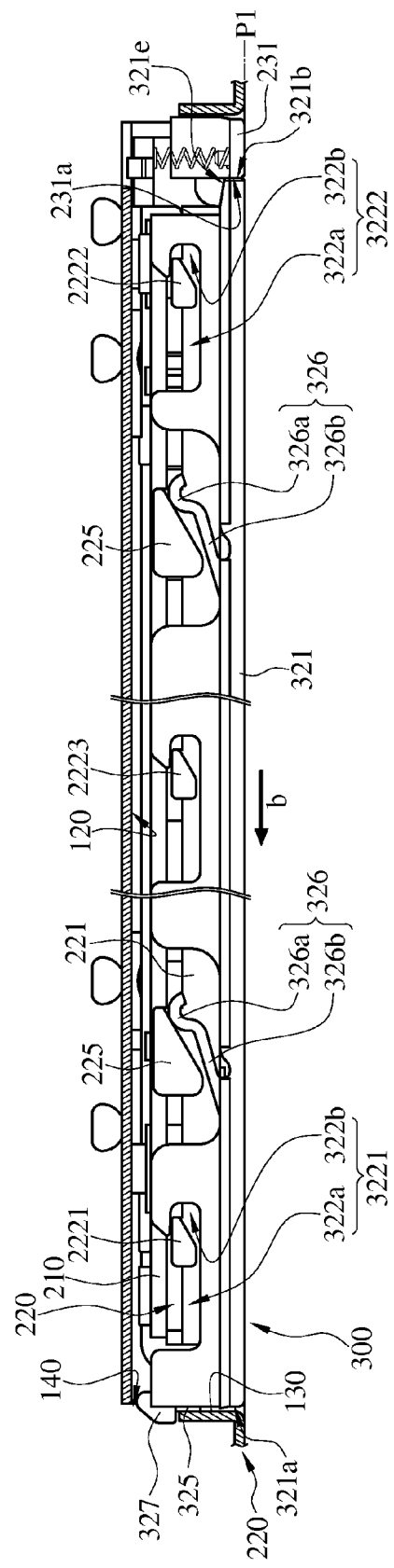
FIG. 6A is a cross-sectional view along a line 6A-6A of the panel module fixed with the circuit board module in FIG. 1B according to the embodiment of the disclosure.
Figure 6B:
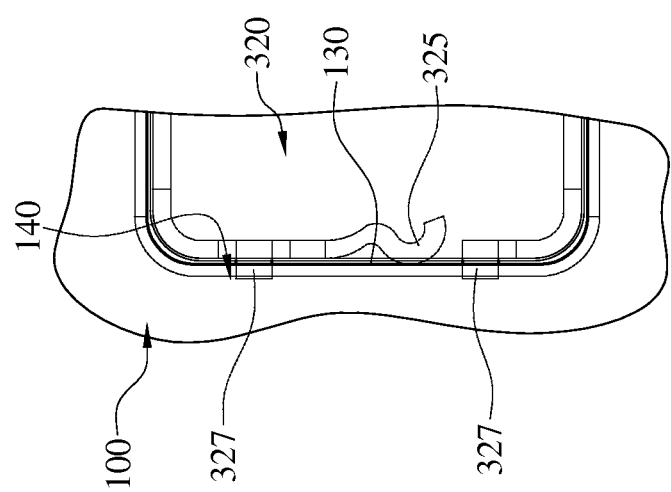
FIG. 6B is a partial front view of the panel module fixed with the circuit board module in FIG. 1B according to the embodiment of the disclosure.
Figure 7:
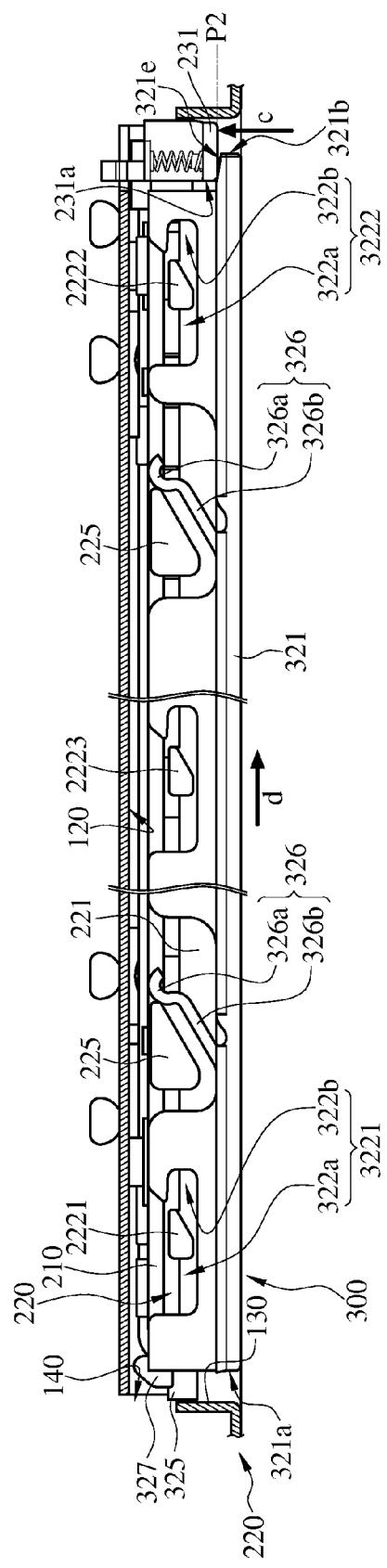
FIG. 7 is a cross-sectional view of the panel module moving along the second axis and the button at the releasing position in FIG. 6A according to the embodiment of the disclosure.
Figure 8:
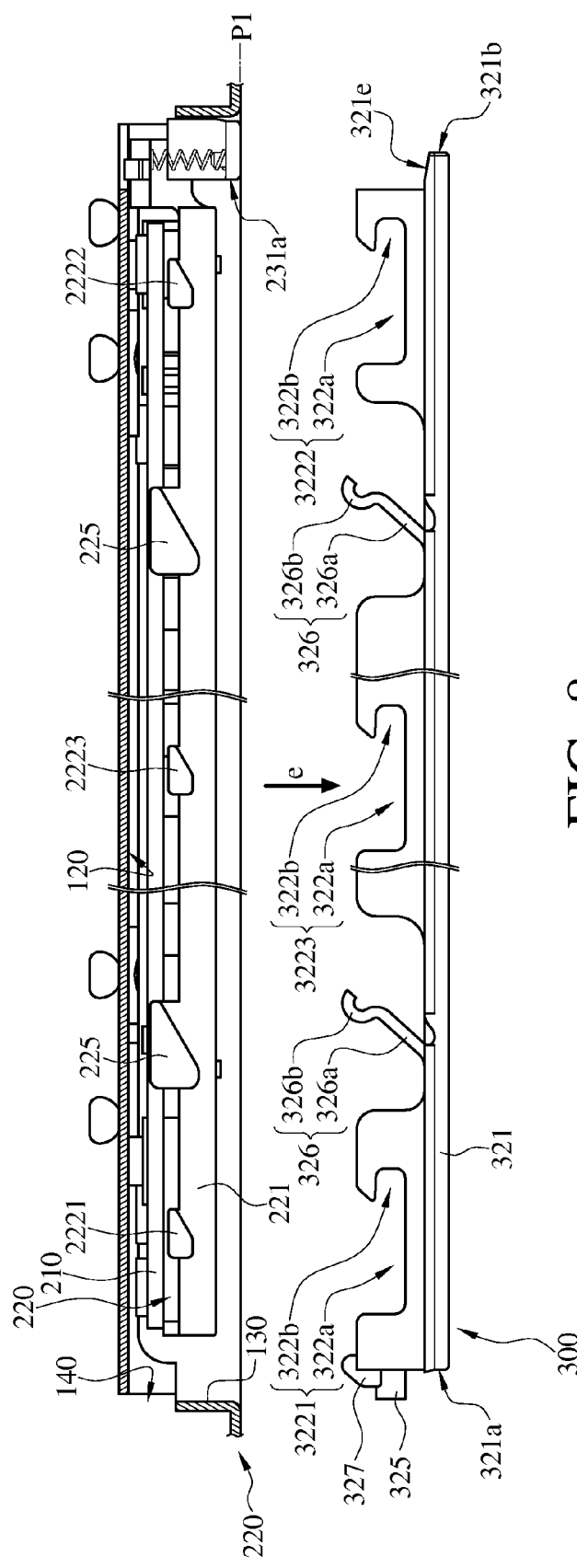
FIG. 8 is a cross-sectional view of the panel module moving along the second axis and leaving from the accommodating space in FIG. 7 according to the embodiment of the disclosure.

Please refer to FIG. 4 to FIG. 8, wherein FIG. 4 is a cross-sectional view of the circuit board module and the panel module separated in FIG. 1B according to the embodiment of the disclosure. FIG. 5A is a cross-sectional view of the panel module pressing the button in FIG. 1B according to the embodiment of the disclosure. FIG. 5B is a partial front view of the panel module pressing the button in FIG. 1B according to the embodiment of the disclosure. FIG. 6A is a cross-sectional view along a line 6A-6A of the panel module fixed with the circuit board module in FIG. 1B according to the embodiment of the disclosure. FIG. 6B is a partial front view of the panel module fixed with the circuit board module in FIG. 1B according to the embodiment of the disclosure. FIG. 7 is a cross-sectional view of the panel module moving along the second axis and the button at the releasing position in FIG. 6A according to the embodiment of the disclosure. FIG. 8 is a cross-sectional view of the panel module moving along the second axis and leaving from the accommodating space in FIG. 7 according to the embodiment of the disclosure. FIG. 4, FIG. 5A, FIG. 7 and FIG. 8 show the cross-sectional views from the same viewpoint as the cross-sectional view of FIG. 6A.

As shown in FIG. 4, the panel module 300 and the circuit board module 200 are separated from each other, and the button 230 is pressed by the elastic piece 240 to be located at the restricting position P1, normally.

As shown in FIG. 5A and FIG. 5B, the panel module 300 is moved along the direction of the arrow a (being parallel to the first axis A1) so that the pressing surface 321e of the second plate 321 presses and pushes the button 230 accordingly to move toward the bottom surface 120 to the releasing position P2. At the same time, the fixing blocks 222 enter the releasing sections 322a of the fixing slots 322, respectively, and the second tilting sections 326b of the second elastic arms 326 are pressed against the pressing blocks 225 along the first axis A1 to store elastic potential energy, respectively.

As shown in FIG. 6A and FIG. 6B, when the panel module 300 is moved along the direction of the arrow b (being parallel to the second axis A2), the relation between the circuit board module 200 and the panel module 300 is described below. First, the two fixing bumps 327 on the second plate 321 are fixed with the fixing grooves 140 on the side surface 130, and the first elastic arms 325 is pressed by the side surface 130 so as to store elastic potential energy (shown in FIG. 6A). Second, the fixing blocks 222 are slid from the releasing sections 322a to the fixing sections 322b of the fixing slots 322, respectively, so that the fixing blocks 222 are fixed in the fixing slots 322, respectively. Third, the second tilting sections 326b of the second elastic arms 326 are pressed by the pressing blocks 225 along the second axis A2, respectively, so as to store elastic potential energy, respectively. Fourth, the pressing surface 321e of the second plate 321 is separated from the button 230. Thus, the elastic force stored in the elastic piece 240 drives the button 230 to go back to the restricting position P1, which causes the limiting surface 231a to interfere with the second plate 321. The position of the first plate 221 is limited between the limiting surface 231a and the side surface 130.

As shown in FIG. 7, the button 230 is pressed to move along the direction of the arrow c (being parallel to the first axis A1) to the releasing position P2. At this time, due to the separation between the limiting surface 231a and the second plate 321, the elastic potential energy, stored in the first elastic arm 325 and the second elastic arms 326, provides the elastic recovery force, which pushes the panel module 300 to move along the direction of the arrow d (being parallel to the second axis A2). Hence, the two fixing bumps 327 on the second plate 321 are left from the two fixing grooves on the side surface 130, respectively, and each fixing block 222 is slid from the fixing section 322b to the releasing section 322a of each fixing slot 322.

As shown in FIG. 8, the elastic potential energy stored in the second elastic arms 326 continuously provides the elastic recovery force along the first axis A1 so as to push the panel module 300 out of the accommodating space 110 along the direction of arrow E (being parallel to the first axis A1).

According to the foregoing description of movement, because the first elastic arm 325 and the second elastic arms 326 of the panel module 300 in the present embodiment provide the elastic recovery force along the first axis A1 and the second axis A2, the user only needs to push the button 230 to the releasing position P2 so that the elastic recovery force along the two axes can push the panel module 300 out of the accommodating space 110. Moreover, due to the elastic recovery force along the two axes provided by the second elastic arms, there is no need to set a spring between the circuit board module 200 and the panel module 300 in order to provide another elastic force along the first axis A1, which simplifies the assembling process of the server 10 with the detachable panel module.

Moreover, the panel 310 and the circuit board 210 are separated and located in different modules which makes replacing panel module 300 become easier. The panel module 300 with no circuit board 210 inside is lighter than the panel module with circuit board inside. Therefore, the panel module 300 with no circuit board 210 inside can leave from the accommodating space 110 only by the elastic recovery force from the first elastic arm 325 and the second elastic arms 326.

In the embodiment above, referring to FIG. 1A, both the numbers of the fixing blocks 222 and the fixing slots 322 on each side of the first plate 221 and the second plate 321 are three, so that the fixed effect between the panel module 300 and the circuit board module 200 exists not only at the two end portions but at the middle portion. However, the disclosure is not limited to the numbers of the fixing blocks and the fixing slots.

Figure 9:
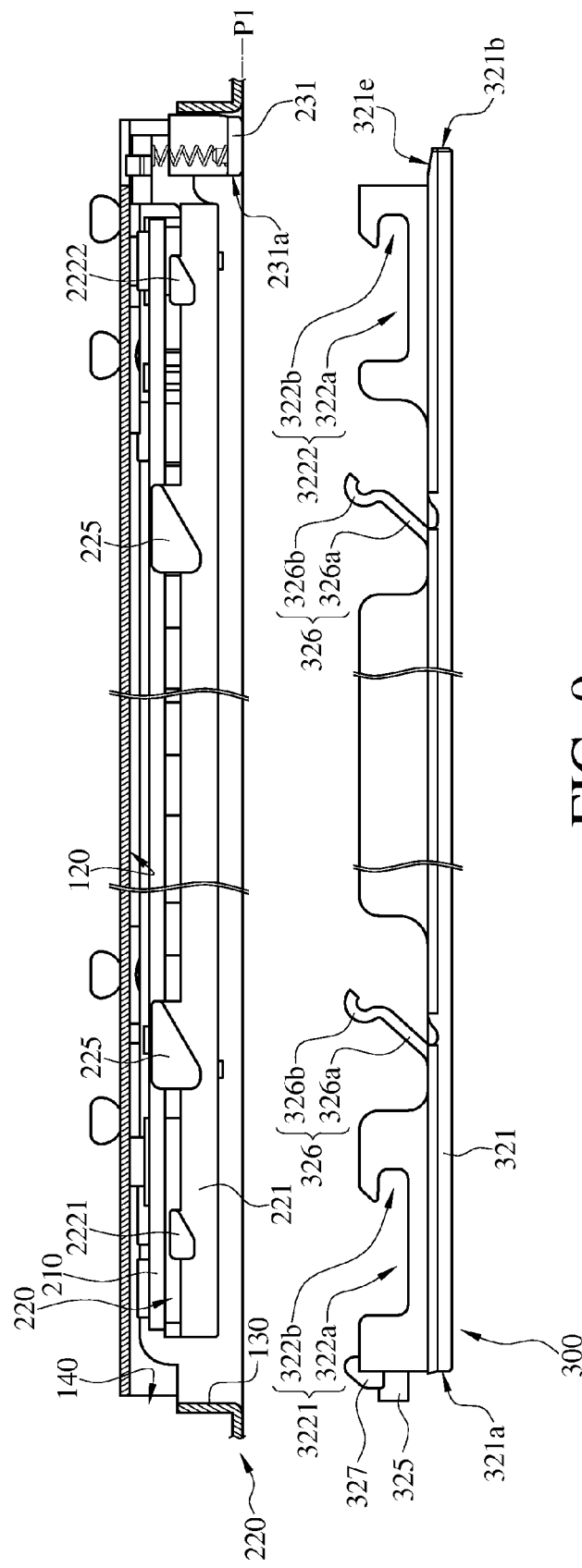
FIG. 9 is a cross-sectional view of the panel module separated from the circuit board module according to another embodiment of the disclosure.

Please referring to FIG. 9, which is a cross-sectional view of the panel module separated from the circuit board module according to another embodiment of the disclosure. FIG. 9 shows the cross-sectional views from the same viewpoint as the cross-sectional view of FIG. 6A. The embodiment shown in FIG. 9 is similar to the embodiment shown in FIG. 1A except that both the numbers of the fixing blocks 222 and the fixing slots 322 on each side of the first plate 221 and the second plate 321 are two.

In this embodiment, the fixing blocks 222 comprise two first fixing blocks 2221 and two second fixing blocks 2222. One of the first fixing blocks 2221 and one of the second fixing blocks 2222 are located on two ends of the top side of the first plate 221 that are opposite to each other. The other first fixing block 2221 and the other second fixing block 2222 are located on the two ends of the bottom side of the first plate 221 that are opposite to each other. The fixing slots 322 comprise two first fixing slots 3221 and two second fixing slots 3222. The first fixing block 2221 and the second fixing block 2222 are fixed in the first fixing slot 3221 and the second fixing slot 3222, respectively, so that the second assembling frame 320 is fixed on the first assembling frame 220.

In the embodiment above, referring to FIG. 1A, the number of the second elastic arm 326 is two, and the two second elastic arms 326 are connected to the top side 321c and the bottom side 321d of the second plate 321. However, the disclosure is not limited to the number of the second elastic arms.

Figure 10:
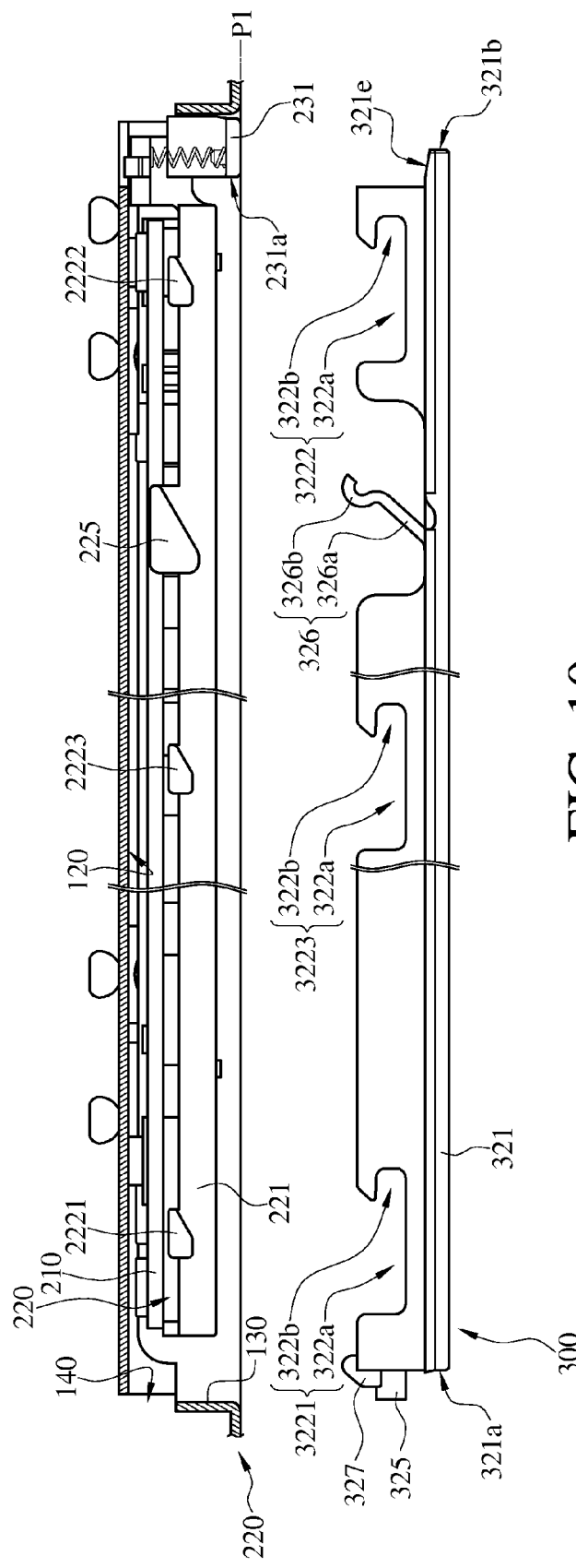
FIG. 10 is a cross-sectional view of the panel module separated from the circuit board module according to the other embodiment of the disclosure.

Please refer to FIG. 10, which is a cross-sectional view of the panel module separated from the circuit board module according to the other embodiment of the disclosure. FIG. 10 shows the cross-sectional views from the same viewpoint as the cross-sectional view of FIG. 6A. The embodiment shown in FIG. 10 is similar to the embodiment shown in FIG. 1A except that the number of the second elastic arm 326 is one, and the second elastic arm 326 is located on the second side surface 321b of the second plate 321 so as to provide stronger elastic recovery force.

It is worth noting that the detachable panel modules of the above embodiments of the disclosure are used in the field of server but the disclosure is not limited to the field of server. In other embodiments, the detachable panel module is applied to other electrical devices such as a monitor or a notebook. In this embodiment, the circuit board module 200 and the panel module 300 described above, for example, are installed in a bearing case. The bearing case, for example, is the case of a monitor or the case of a notebook with an accommodating space similar to that of the above-mentioned embodiments.

According to the server with the detachable panel module and the detachable module structure disclosed in the embodiment of the present disclosure, when the button is at the releasing position and separated from the second plate, the elastic recovery forces provided by the first elastic arm and the second elastic arm, which are applied along the two axes, drive the panel module to slide along the second axis and the first axis in sequence so as to leave from the accommodating space. As a result, it is easier to detach the panel module to replace the panel.

Moreover, the panel and the circuit board are separated and located in different modules which make replacing the panel module become easier. The panel module with no circuit board inside is lighter than the panel module with circuit board inside. Therefore, the panel module with no circuit board inside can leave from the accommodating space only by the elastic recovery force from the first elastic arm and the second elastic arms.

What is claimed is:

1. A server with a detachable panel module, comprises:
   a case having an accommodating space formed by a bottom surface and a side surface;
   a circuit board module, comprising:
      a circuit board;
      a first assembling frame comprising a first plate, a plurality of fixing blocks and at least a pressing block, the first plate installed in the accommodating space, both of the plurality of fixing blocks and the pressing block connected to the first plate, and the circuit board installed on the first plate; and
      a button set on the first plate and having a limiting surface, the limiting surface facing the side surface, the button being movable relative to the bottom surface to have a restricting position and a releasing position, the releasing position being closer to the bottom surface than the restricting position; and
   a panel module, comprising:
      a panel; and
      a second assembling frame comprising a second plate, a first elastic arm and at least a second elastic arm, the second plate having a plurality of fixing slots corresponding to the plurality of fixing blocks, respectively, the first elastic arm and the second elastic arm both connected to the second plate and corresponding to the side surface and the pressing block, respectively, the panel installed on the second plate, the second assembling frame detachably installed in the accommodating space;
   wherein, when the second assembling frame is in the accommodating space, and the button is at the restricting position, the plurality of fixing slots are fixed with the plurality of fixing blocks, and the first elastic arm and the second elastic arm are pressed by the side surface and the pressing block, respectively, so as to store an elastic potential energy, the limiting surface interferes with the second plate so as to fix the second assembling frame in the accommodating space; when the button is moved from the restricting position to the releasing position, the limiting surface leaves from and stops interfering with the second plate, the elastic potential energy released by the first elastic arm drives the second plate to move toward a direction away from the side surface and drives the plurality of fixing slots to leave from the plurality of fixing blocks, and the elastic potential energy released by the second elastic arm drives the second plate to move toward a direction away from the bottom surface.

2. The server of claim 1, wherein a first axis is defined as being parallel to a normal line of the bottom surface, and a second axis is defined as being parallel to a normal line of the side surface, the elastic potential energy released by the first elastic arm drives the second plate to move along the second axis and toward the direction away from the side surface, and then the elastic potential energy released by the second elastic arm drives the second plate to move along the first axis and toward the direction away from the bottom surface.

3. The server of claim 2, wherein the fixing slot further has a releasing section and a fixing section both extending along the second axis, the second plate further has a pressing surface facing the bottom surface, when the plurality of fixing blocks enter the releasing section, the pressing surface presses the button to move to the releasing position.

4. The server of claim 3, wherein when the second assembling frame is slid along the second axis to slide the plurality of fixing blocks from the releasing section to the fixing section, the pressing surface leaves from the button to drive the button to return to the restricting position so as to make the limiting surface interfere with the second plate.

5. The server of claim 2, wherein the second elastic arm comprises a first tilting section and a second tilting section that are connected with each other, an angle between an extending direction of the first tilting section and the second axis is smaller than an angle between an extending direction of the second tilting section and the second axis.

6. The server of claim 5, wherein a number of the at least a second elastic arm is two, the two second elastic arms are located at two sides of the second plate are opposite to each other, respectively.

7. The server of claim 2, wherein the plurality of fixing blocks comprises a first fixing block and a second fixing block, the first fixing block and the second fixing block located at two sides of the first plate are opposite to each other, respectively, the plurality of fixing slots comprise a first fixing slot and a second fixing slot, the first fixing slot and the second fixing slot are formed on two sides of the second plate opposite to each other, respectively, and the first fixing block and the second fixing block are detachably fixed to the first fixing slot and the second fixing slot, respectively.

8. The server of claim 7, wherein the plurality of fixing blocks further comprise a third fixing block located between the first fixing block and the second fixing block, the plurality of fixing slots further comprise a third fixing slot located between the first fixing slot and the second fixing slot, the third fixing block is detachably fixed to the third fixing slot.

9. The server of claim 2, wherein the case further has a fixing groove located at the side surface, the second assembling frame further comprises a fixing bump, the second plate has a first side surface and a second side surface that are opposite to each other, the fixing bump is located at the first side surface, when the second assembling frame is installed in the accommodating space, the fixing bump is fixed with the fixing groove and the limiting surface of the button interfere with the second side surface.

10. The server of claim 2, further comprising an elastic piece, the first plate having an assembling hole, the button comprising a pressing plate, a connecting block and a restricting block, the pressing plate and the restricting block connected to two sides of the connecting block are opposite to each other, respectively, the connecting block passing through the assembling hole, the elastic piece interposed between the first plate and the pressing plate so that the restricting block leans against a side of the first plate away from the pressing plate.

11. A detachable module structure, comprising:
a bearing case having an accommodating space formed by a bottom surface and a side surface;
a circuit board module, comprising:
a circuit board;
a first assembling frame comprising a first plate and a plurality of fixing blocks, the first plate installed in the accommodating space, the plurality of fixing blocks connected to the first plate, and the circuit board installed on the first plate; and
a button set on the first plate and having a limiting surface, the limiting surface facing the side surface, the button being movable relative to bottom surface to have a restricting position and a releasing position, the releasing position being closer to the bottom surface than the restricting position; and
a panel module, comprising:
a panel; and
a second assembling frame comprising a second plate and a first elastic arm, the second plate having a plurality of fixing slots corresponding to the plurality of fixing blocks respectively, the first elastic arm connected to the second plate and corresponding to the side surface, the panel installed on the second plate, the second assembling frame detachably set in the accommodating space;
wherein, when the second assembling frame is in the accommodating space, and the button is at the restricting position, the plurality of fixing slots are fixed with the plurality of fixing blocks, and the first elastic arm is pressed by the side surface so as to store an elastic potential energy, the limiting surface interferes with the second plate so as to fix the second assembling frame in the accommodating space, when the button is moved from the restricting position to the releasing position, the limiting surface leaves from and stops interfering with the second plate, the elastic potential energy released by the first elastic arm drives the second plate to move toward a direction away from the side surface and drives the plurality of fixing slots to leave from the plurality of fixing blocks.

12. The detachable module structure of claim 11, wherein the first assembling frame further comprises at least a pressing block, the pressing block is connected to the first plate, the second assembling frame further comprises at least a second elastic arm, the second elastic arm is connected to the second plate and corresponding to the pressing block, when the second assembling frame is in the accommodating space, and the button is at the restricting position, the second elastic arm is pressed by the pressing block so as to store the elastic potential energy, when the button is moved from the restricting position to the releasing position, and the limiting surface leaves from and stops interfering with the second plate, the elastic potential energy released by the second elastic arm drives the second plate to move along a first axis and toward a direction away from the bottom surface.

13. The detachable module structure of claim 12, wherein the first axis is defined as being parallel to a normal line of the bottom surface, and a second axis is defined as being parallel to a normal line of the side surface, the elastic potential energy released by the first elastic arm drives the second plate to move along the second axis and toward the direction away from the side surface, and then the elastic potential energy released by the second elastic arm drives the second plate to move along the first axis and toward the direction away from the bottom surface.

14. The detachable module structure of claim 13, wherein the fixing slot further has a releasing section and a fixing section both extending along the second axis, the second plate further has a pressing surface facing the bottom surface, when the plurality of fixing blocks enter the releasing section, the pressing surface presses the button to move to the releasing position.

15. The detachable module structure of claim 14, wherein when the second assembling frame is sliding along the second axis to slide the plurality of fixing blocks from the releasing section to the fixing section, the pressing surface leaves from the button to drive the button to return to the restricting position so as to make the limiting surface interfere with the second plate.

16. The detachable module structure of claim 13, wherein the second elastic arm comprises a first tilting section and a second tilting section that are connected with each other, an angle between an extending direction of the first tilting section and the second axis is smaller than an angle between an extending direction of the second tilting section and the second axis.

17. The detachable module structure of claim 16, wherein a number of the at least a second elastic arm is two, the two second elastic arms are located at two sides of the second plate opposite to each other, respectively.

18. The detachable module structure of claim 13, wherein the plurality of fixing blocks comprises a first fixing block and a second fixing block, the first fixing block and the second fixing block located at two sides of the first plate opposite to each other, respectively, the plurality of fixing slots comprise a first fixing slot and a second fixing slot, the first fixing slot and the second fixing slot are formed on two sides of the second plate opposite to each other, respectively, and the first fixing block and the second fixing block are detachably fixed to the first fixing slot and the second fixing slot, respectively.

19. The detachable module structure of claim 18, wherein the plurality of fixing blocks further comprise a third fixing block located between the first fixing block and the second fixing block, the plurality of fixing slots further comprise a third fixing slot located between the first fixing slot and the second fixing slot, the third fixing block is detachably fixed to the third fixing slot.

20. The detachable module structure of claim 13, wherein the bearing case further has a fixing groove located at the side surface, the second assembling frame further comprises a fixing bump, the second plate has a first side surface and a second side surface that are opposite to each other, the fixing bump is located at the first side surface, when the second assembling frame is installed in the accommodating space, the fixing bump is fixed with the fixing groove and the limiting surface of the button interfere with the second side surface.

21. The detachable module structure of claim 13, further comprising an elastic piece, the first plate having an assembling hole, the button comprising a pressing plate, a connecting block and a restricting block, the pressing plate and the restricting block connected to two sides of the connecting block are opposite to each other, respectively, the connecting block passing through the assembling hole, the elastic piece interposed between the first plate and the pressing plate so that the restricting block leans against a side of the first plate away from the pressing plate.

* * * * *